(12) United States Patent
Kim et al.

(10) Patent No.: US 6,337,221 B1
(45) Date of Patent: Jan. 8, 2002

(54) DIE BONDING METHOD FOR MANUFACTURING FINE PITCH BALL GRID ARRAY PACKAGES

(75) Inventors: Sang-Geun Kim; Seung-Chui Ahn, both of Choongchungnam-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/406,916

(22) Filed: Sep. 24, 1999

(30) Foreign Application Priority Data

Sep. 30, 1998 (KR) .......................................... 98-41085

(51) Int. Cl.[7] .............................................. H01L 21/66
(52) U.S. Cl. ........................... 438/15; 438/14; 438/110
(58) Field of Search ........................ 438/1–983; 29/827

(56) References Cited

U.S. PATENT DOCUMENTS

| | | | | |
|---|---|---|---|---|
| 5,654,204 A | * | 8/1997 | Anderson ..................... | 438/15 |
| 5,893,724 A | * | 4/1999 | Chakravorty et al. ....... | 438/108 |
| 5,894,659 A | * | 4/1999 | Kwok et al. ................. | 29/827 |
| 5,995,218 A | * | 11/1999 | Ide .......................... | 356/237.1 |
| 6,021,380 A | * | 2/2000 | Fredriksen et al. .......... | 702/35 |

* cited by examiner

Primary Examiner—Charles Bowers
Assistant Examiner—Scott Geyer
(74) Attorney, Agent, or Firm—Skjerven Morrill MacPherson LLP; David W. Heid

(57) ABSTRACT

Die bonding equipment for fine pitch ball grid array package includes: a semiconductor chip pickup stage for inspecting a status of a loaded semiconductor chip and a corresponding position thereof; an alignment stage on which the semiconductor chip fixed on a mount head is aligned; a chip transfer unit for transferring the semiconductor chip from the semiconductor chip pickup stage to the alignment stage; a guide rail for guiding a mount tape frame; a status inspecting unit disposed at a selected position over the guide rail, for inspecting a status and a position of the land pattern on the mount tape frame; and a bonding unit for bonding the land pattern to the semiconductor chip which is mounted on the mount head. The equipment only bonds semiconductor chips (good or defective) to lands patterns having the same status (good or defective).

15 Claims, 9 Drawing Sheets

| | $T_1$ | $T_2$ | $T_3$ | $T_4$ | $T_5$ | $T_6$ | $T_7$ | $T_8$ | $T_9$ | $T_{10}$ |
|---|---|---|---|---|---|---|---|---|---|---|
| 1 | G | G | G | F | G | G | G | G | G | G |
| 2 | F | G | G | G | G | G | F | G | G | F |
| 3 | G | G | G | G | G | G | F | G | G | G |

DIE BONDING METHOD FOR MANUFACTURING FINE PITCH BALL GRID ARRAY PACKAGES

BACKGROUND OF THE INVENTION

1. Field of the Invention

The present invention relates to die bonding equipment and methods for the fabrication of ball grid packages and more particularly to a die bonding method capable of detecting a failure of a land pattern on a mount tape before a chip transfer unit picks up a chip and capable of matching a good land pattern to a good semiconductor chip and a failed land pattern to a failed semiconductor chip.

2. Description of the Related Art

Recently, technologies for packaging semiconductor chips have rapidly developed with the development of thin film forming technologies. Ball grid array packages, currently in use, are a result of the application of such technologies. A ball grid array package uses a flexible tape in place of a lead frame. The flexible tape includes a conductive pattern formed thereon. One end of the conductive pattern is soldered to terminals of a printed circuit board by a solder ball interposed therebetween, and the other end is bonded to bonding pads that act as input and output terminals of a semiconductor chip.

In the fabrication of ball grid array packages, the process of attaching solder balls is the last step, which provides various advantages in carriage and handling of elements for a die attaching process and in mass production. Ball grid array packages also make unnecessary the trimming and forming processes that are indispensable in fabrication of more conventional packages.

Recently developed chip scale packages have a fine pitch in which the pitch of solder balls ranges from a few tens of microns to a few hundreds of microns and sizes of such packages approach about 120% of the chip sizes.

To form a fine pitch ball grid package, multiple land patterns are first formed on a rectangular, polyimide based tape. Throughholes are formed at selected portions of the polyimide based tape. The land patterns include solder ball pads, which are on a first surface of the polyimide based tape such that each of the pads covers a corresponding throughhole and has a circular plate shape. The land patterns also include conductive patterns that electrically connect to respective solder ball pads and extend to edges of the tape.

Beam leads, that is, the ends of the conductive patterns, are die-bonded to respective bonding pads of semiconductor chip. For such die bonding, rectangular openings or window,; are formed at edges of the polyimide based tape. After the die bonding, an electrical test determines whether or not the land patterns have open or short failures and from the electrical test, failed land patterns are marked. An elastomer is attached to a second surface of the polyimide based tape.

Continuously, the polyimide based tape on which the elastomer is attached is rolled, and the rolled tape is cut to length, for example, to include a number of land patterns. Hereinafter, a rolled tape having the above mentioned unit length is referred to as one base mount tape. A base mount tape's edge portions are attached to a square mount tape frame using an adhesive tape.

Semiconductor chips separated by sawing a wafer are transferred to corresponding base mount tapes, and a press head die bonds bonding pads of each of the semiconductor chips with beam leads exposed through open windows of base mount tape.

Afterwards, base mount tapes having semiconductor chips attached are subject to a solder ball attaching process. The solder ball attaching process attaches solder balls to solder ball pads through the throughholes in the base mount tape. The above solder ball attaching process prepares multiple ball grid array packages having a fine pitch. The multiple ball grid array packages are separated into individual ball grid array packages, and the individual ball grid array packages are tested. Thus, the above processes fabricate ball grid array packages.

FIG. 1 shows conventional die bonding equipment 100 for fabrication of ball grid array packages having a fine pitch. Referring to FIG. 1, die bonding equipment 100 generally includes a wafer mount frame stocker 5, a base mount stocker 10, a chip pickup table 15, and a bonding unit 20 on a support plate 1. A chip transfer unit 25 moves a semiconductor chip from the chip pickup table 15 to the bonding unit 20, and a guide rail unit 40 guides a base mount tape frame 35 from the base mount tape stocker 10 to the bonding unit 20. Multiple charge coupled device(CCD) cameras observe the operation of die bonding equipment 100.

In FIG. 1, the chip pickup table 15 faces an opening 50 of the wafer mount frame stocker 5 so that a wafer mount frame 45 carrying multiple semiconductor chips can be loaded into or unloaded from the wafer mount frame stocker 5. A square chip tray 55 that is attached to the chip pickup table 15 receives failed semiconductor chips. The chip tray 55 moves together with the chip pickup table 15 in an X-Y plane.

Meanwhile, an alignment table 65, which includes a mount head 60, is spaced apart from the chip pickup table 15. The mount head 60 receives a semiconductor chip from the chip pickup table 15, moves the received semiconductor chip to the bonding unit 20, and aligns the semiconductor chip for die bonding. To align the semiconductor chip, the alignment table 65 can freely move along X-Y coordinate axes as does the chip pickup table 15, and when the semiconductor chip is skewed from the required orientation for bonding of the chip, the alignment table 65 rotates the skewed semiconductor chip for the required alignment. The alignment table 65 can also move along the Z coordinate axis direction.

Here, the chip transfer unit 25, which reciprocates between the chip pickup table 15 and the alignment table 65, transfers semiconductor chips from the wafer mount frame 45 of the chip pickup table 15. The chip transfer unit 25 includes: a collet 70 (hereinafter referred to as the first collet) for holding good semiconductor chips with a vacuum; a collet 75 (hereinafter referred to as the second collet) for holding failed semiconductor chips; and a moving block 80 including a collet selection unit (not shown) that selects the first or second collet 70 or 75 for use. The chip transfer unit 25 also includes a straight line reciprocating unit (not shown) for transferring the moving block 80.

The described base mount tape stocker 10 is spaced away from the wafer mount frame stocker 5. The guide rail unit 40 extends from an opening 85 of the base mount tape stocker 10, and a base mount tape frame 35 received at the base mount tape stocker 10 is unloaded through the opening 85. The guide rail unit 40 includes a pair of guide rails 42 and 44 that guide the base mount tape frame 35.

A bonding unit 20 is over the guide rails 42 and 44 and distant from the base mount tape stocker 10. The bonding unit 20 includes a press head 22, which moves up and down, and a bonding unit CCD camera 24, which moves together with the press head 22. The press head 22 is over the base mount tape frame 35, and the mount head 60 is below the base mount tape frame 35 so that the press head 22 faces the mount head 60. The bonding unit CCD camera 24 checks the position of the base mount tape frame 35 as it moves and simultaneously checks for a failed mark formed during the production of the base mount tape.

In addition to the bonding unit CCD camera 24, the conventional die bonding equipment typically includes two other CCD cameras. A chip pickup table CCD camera 17 is for determining a position of a failed semiconductor chip or a good semiconductor chip among the chips sawed from a wafer, and an alignment table CCD camera 62 is for checking the alignment of a semiconductor chip on the mount head 60 of the alignment table 65.

Hereinafter, the operation of the conventional die bonding equipment is described with reference to FIG. 1.

First, prior to starting the die bonding process, an operator discriminates failed semiconductor chips from a sawed wafer mounted on the wafer mount frame 45 and manually loads the discriminated failed semiconductor chips into the failed semiconductor chip tray 55. This avoids an increase in the loading time for loading of failed semiconductor chips. Such increases in the loading time occur when another wafer is loaded to start a process after processing of a wafer is completed, a corresponding land pattern to be bonded among base mount tapes is failed, and there are no failed semiconductor chips on the wafer mount frame 45.

The operator loads all failed semiconductor chips in the failed semiconductor chip tray 55, and then an unloading unit unloads one sheet of wafer mount frame 45 from the wafer mount frame stocker 5 and fixes the sheet to the chip pickup table 15.

The chip pickup table CCD camera 17 continuously images semiconductor chips on the chip pickup table 15 to discriminate between good semiconductor chips and defective semiconductor chips.

An X-Y table moves the chip pickup table 15 so that a good semiconductor chip is below the first collet 70 of the chip transfer unit 25. To shorten the bonding time, the first collet 70 picks up and stands by with a good semiconductor chip.

Concurrently with the stand by of the first collet 70, the mount tape frame 35 is unloaded from the mount tape stocker 10 and moves to the bonding unit 20 along the guide rail unit 40. At this time, the bonding unit CCD camera 24 of the press head 22 photographs a first land pattern that is being processed first, to thereby discriminate whether the first land pattern is good or defective.

Here, when the first land pattern is good, the good semiconductor chip held by the first collet 70 is moved onto the mount head 60 of the chip alignment table 65 and is then aligned. Thereafter, the aligned good semiconductor chip is transferred onto a corresponding good land pattern of the base mount tape 30 by the movement of the mount head 60. After the transfer of the good chip, the press head 22 moves downward and the mount head 60 moves upward, so that bonding pads of the good semiconductor chip are bonded to beam leads of the good land pattern.

Meanwhile, when the first land pattern as discriminated is defective, the good semiconductor chip held by the first collet 70 returns to an original position. Then, the second collet 75 instead of the first collet 70 picks up the defective semiconductor chip and moves the defective chip onto the mount head 60. Thereafter, the defective chip is transferred to a corresponding defective land pattern of the base mount tape 30 by the movement of the mount head 60 without a specific alignment. After the transfer of the defective chip, the press head 22 moves downward and the mount head 60 moves upward, so that bonding pads of the defective semiconductor chip are bonded to beam leads of the defective land pattern.

First, when a land pattern of the base mount tape to be die bonded is determined to be defective, the first collet 70 of the chip transfer unit 25 holds the good semiconductor chip. Therefore, the first collet 70 returns the good semiconductor chip to an original position. Instead of the first collet 70, the second collet 75 holds a defective semiconductor chip on the mount head Accordingly, a delay occurs.

Second, the bonding unit CCD camera determines whether the land pattern of the base mount tape is good or not during the die bonding time. Accordingly, much time is spent in determining the status of the semiconductor chip.

Third, an operator must manually pick up a defective semiconductor chip from the wafer mount frame and then load the defective semiconductor chip in tray 55. As a result, loading times lengthen.

Fourth, when a use of a defective semiconductor chip that is received in the defective semiconductor tray is required, X-Y table has to move the semiconductor chip tray below the second collet 75. As a result, the time spent in picking up the received defective semiconductor chips increases.

SUMMARY OF THE INVENTION

It is therefore an object of the present invention to decrease the die bonding time of a ball grid array package having a fine pitch by determining whether a corresponding land pattern of the base mount tape on which a semiconductor chip is being die-bonded, is good or not before a chip transfer unit picks up a semiconductor chip and thereby allowing the chip transfer unit to pick up a semiconductor chip matching the land pattern.

It is another object of the present invention to shorten a time taken in determining whether a land pattern of a base mount tape is good by performing such a determination only once during the loading of the mount tape.

It is yet another object of the present invention to decrease a time taken in picking up defective semiconductor chips by establishing the defective semiconductor chip tray at the lower face of the collet of the semiconductor chip transfer unit along the trace of the collet and thereby allowing the wafer extend table not to be moved in order to pick up a defective semiconductor chip.

It is yet another object of the present invention to shorten the time taken in loading defective semiconductor chips into the defective semiconductor chip tray by allowing the collet of semiconductor chip transfer to perform the work for loading defective semiconductor chips into the defective semiconductor chip tray.

Other objects and advantages of the present invention will be more apparent in view of the description that follows.

One embodiment of the present invention is a die bonding method for a fine pitch ball grid array package. The die bonding method includes inspecting the status and position of a semiconductor chip which is on a mount frame and the status and position of a land pattern of a mount tape, wherein the land pattern is on one surface of the mount tape and the other surface of the mount tape is attached to a surface of the mount frame. Thereafter, the status data and the position data corresponding to the semiconductor chip and the land pattern inspected are stored. After repeating the inspection of one or more semiconductor chips, a semiconductor chip is selected using the stored status data and the position data of the semiconductor chip and the land pattern. The selected semiconductor chip has a status matching to the status of the land pattern at a bonding region for the die bonding. The selected chip is transferred to an alignment region for an operation corresponding to the status of the transferred chip.

Another embodiment of the invention is a die bonding equipment for fine pitch ball grid array packages. The die bonding equipment includes: a semiconductor chip pickup stage for inspecting the status and position of a loaded semiconductor chip, wherein a wafer mount frame is unloaded from a wafer mount frame stocker and the wafer mount frame is loaded on the semiconductor chip pickup stage; an alignment stage spaced apart from the semiconductor chip pickup stage; a chip transfer unit for transferring the semiconductor chip from the semiconductor chip pickup stage to the alignment stage; a guide rail for a mount tape frame having a mount tape on which at least one land pattern is formed, the mount tape frame being transferred from a mount tape frame stocker in which the mount tape frame is received to a die bonding position adjacent to the alignment stage; an inspection system disposed over the guide rail, for inspecting a status and a position of the land pattern on the mount tape frame; and a bonding unit for bonding the land pattern to the semiconductor chip that is mounted on the mount head.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

Die bonding equipment for ball grid array packages having fine pitch according to the present invention is described more fully hereinafter with reference to the accompanying drawings.

Figure 1:
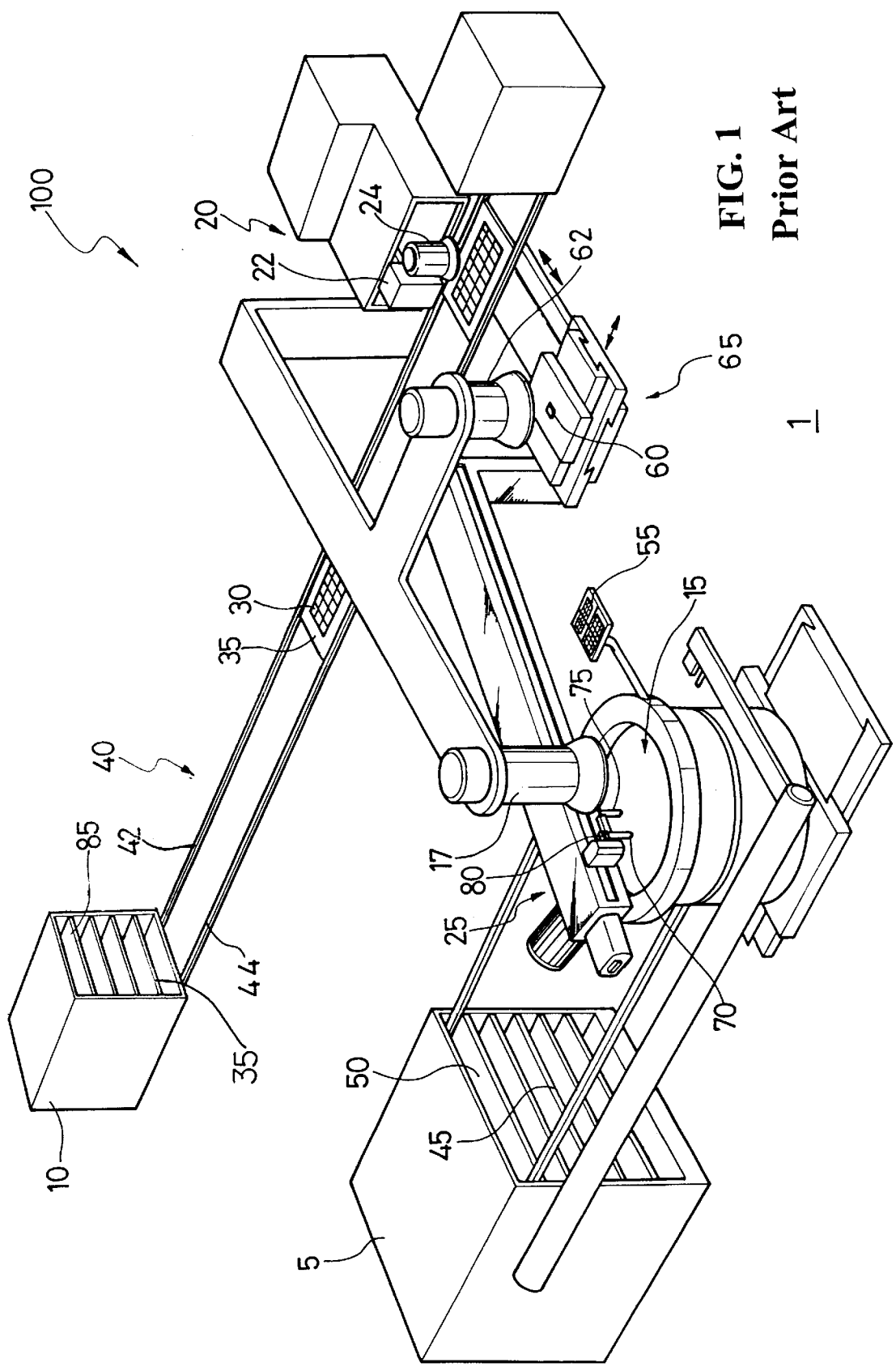
FIG. 1 is a perspective view of a conventional die bonding equipment.
Figure 2:
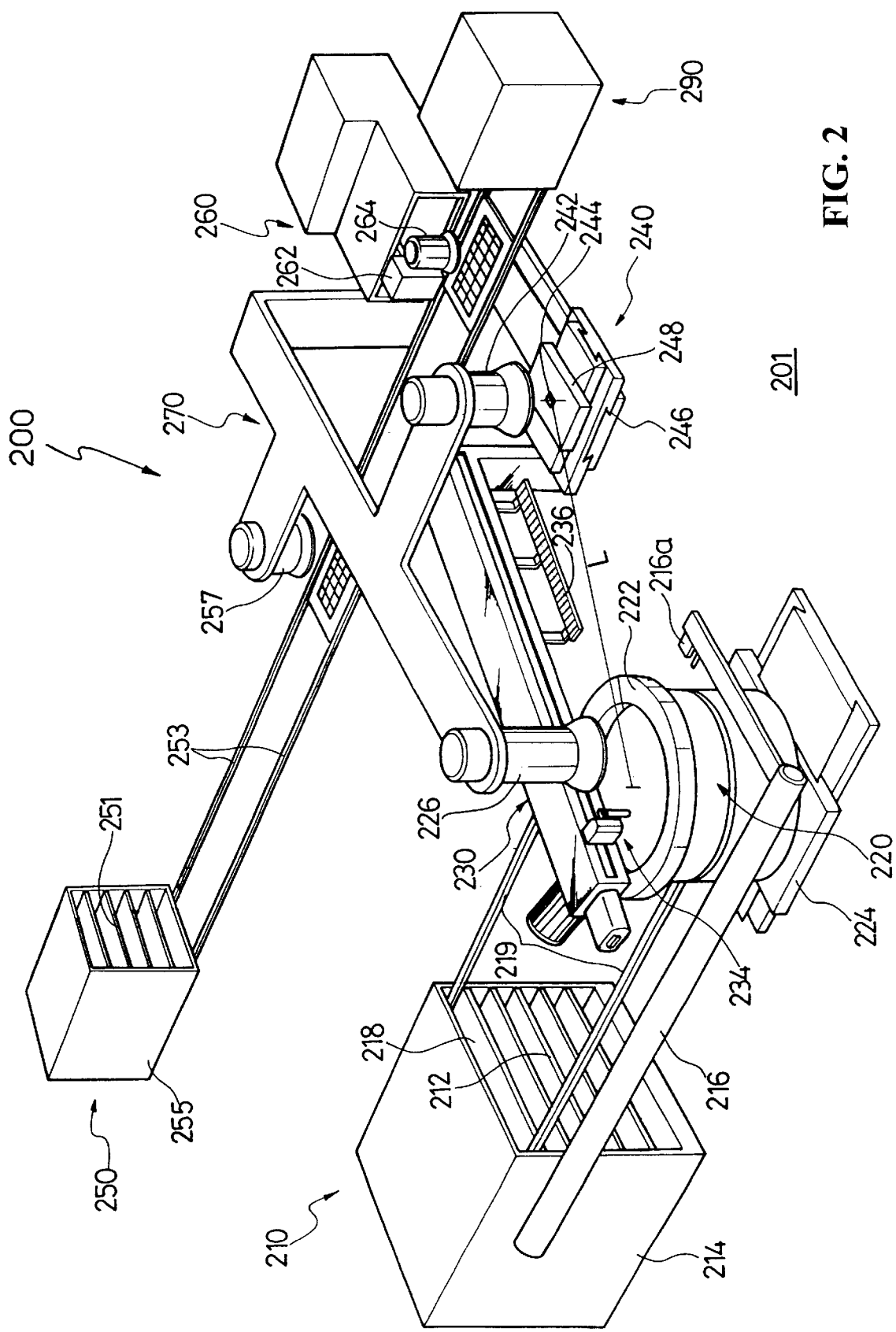
FIG. 2 is a perspective view of a die bonding equipment according to an embodiment of the present invention.

FIG. 2 is a perspective view of die bonding equipment 200 used for the fabrication of ball grid array package having fine pitch according to one embodiment of the present invention. As major components, die bonding equipment 200 includes a support plate 201, a wafer mount frame supplying unit (stocker) 210, a chip pickup stage 220, a bonding unit 260, a chip transfer unit 230, a chip alignment stage 240, a base mount tape supplying unit 250, a mount tape frame loader 290, a control module (not shown), and multiple charge coupled device (CCD) cameras.

Although not shown in the drawings, the control module includes a control unit such as a microprocessor and a memory unit for storing data. Here, the memory unit permits data input and output and can be, for example, a hard disk driver (HDD) or a random access memory (RAM). The memory unit stores status information indicating whether semiconductor chips are good or defective and position data for the good or defective semiconductor chips. The memory unit also stores status information indicating whether land patterns of a base mount tape 251 are good or defective and position data for the land patterns.

The wafer mount supplying unit 210 is disposed on the support plate 201 and includes a wafer mount frame stocker 214 and a mount frame moving unit 216. The wafer mount frame stocker 214, which typically has a hexagonal shape, receives and stores a stack of wafer mount frames. The mount frame moving unit 216 loads or unloads a wafer mount frame 212 from the wafer mount frame stocker 214. The mount frame moving unit 216 includes a pneumatic cylinder and a gripper 216a coupled to an end of the cylinder. The wafer mount supplying unit 210 has one open face 218 such that movement of the mount frame moving unit 216 can load or unload the wafer mount frame 212 via the open face 218. The chip pickup stage 220 is at a position corresponding to the open face 218 of the wafer mount supplying unit 210.

The chip pickup stage 220 includes a ring shaped stage 222 and an X-Y table 224. The X-Y table freely moves the ring shaped stage 222 in an X-Y plane. A chip pickup stage CCD camera 226 is over the chip pickup stage 220 and allows an operator to acquire position data for good or defective semiconductor chips among the semiconductor chips in pickup stage 220.

A guide rail 219 between the chip pickup stage 220 and the wafer mount frame stocker 214 precisely guides the wafer mount frame 212 from the wafer mount frame stocker 214 to the chip pickup stage 220 and allows the wafer mount frame 212, which is being guided, to be aligned with the ring shaped stage 222.

The chip alignment stage 240 is on the support plate 201 and spaced apart from the chip pickup stage 220. The chip alignment stage 240 receives a semiconductor chip from the chip pickup stage 220 and moves and/or rotates the semiconductor chip in the X-Y plane, to thereby align the semiconductor chip for bonding. The chip alignment stage 240 operates according to a control signal of the control module and includes an X-Y table 246, a stage 248 on the upper surface of the X-Y table 246, and a mount head 244. An alignment stage CCD camera 242 is over the chip alignment stage 240. The alignment stage CCD camera 242 confirms the alignment status of the semiconductor chip that is supported and fixed on the mount head 244.

Figure 3:
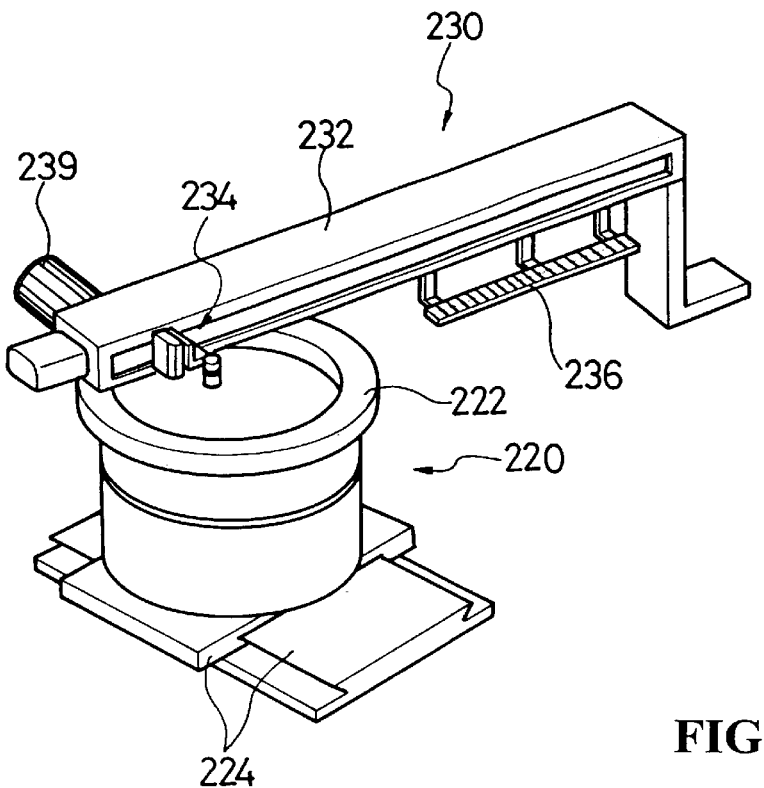
FIG. 3 is a partial perspective view of portions of a transfer unit and a chip pickup stage in the equipment of FIG. 2.
Figure 4:
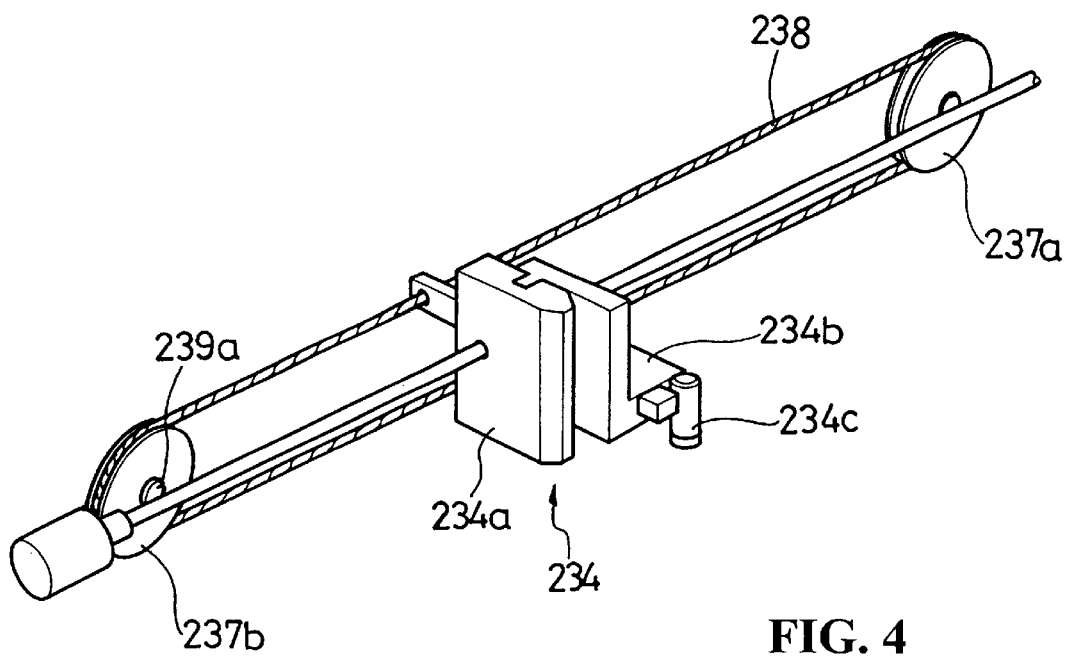
FIG. 4 is a perspective view of a portion of the equipment of FIG. 2 that removes the transfer unit body from the transfer unit.

The chip transfer unit 230 transfers semiconductor chips from the chip pickup stage 220 to the alignment stage 240. FIGS. 3 and 4 illustrate features of an embodiment of the chip transfer unit 230, which is disposed between the chip pickup stage 220 and the chip alignment stage 240. As shown in FIG. 3, the chip transfer unit 230 includes a transfer unit body 232, a collet unit 234, and a defective semiconductor chip tray 236. The transfer unit body 232 has a length greater than the interval L between the central portion of the chip pickup stage and the mount head 244 of the alignment stage 240.

As shown in FIG. 4, a pair of pulleys 237a and 237b are at opposite ends of the inner portion of the transfer unit body 232. A tension wire 238 is around pulleys 237a and 237b and moves when pulleys 237a and 237b rotate. A servo motor 239 attached to a rotational axis 239a of pulley 237a controls the rotation of pulley 27a and thereby controls the direction and distance that the tension wire 238 moves.

The collet unit 234 includes a guide block 234a coupled to the tension wire 238 and a guide bar, a collet support body 234b coupled to the guide block 234a, a collet 234c coupled to the collet support body 234b, and a collet displacement generating unit (not shown) for moving the collet 234c.

The defective semiconductor chip tray 236 is below the transfer unit body 232. The defective semiconductor chip tray 236 is along the transfer path of the collet unit 234, which allows the collet unit 234 to load a defective semiconductor chip from the chip pickup stage 220 and unload the defective semiconductor chip in a single row to the semiconductor chip tray 236.

Returning to FIG. 2, a long guide rail 253 for transferring the base mount frame 251 is adjacent to the chip alignment stage 240. The guide rail 253 has a guide groove (not shown) that couples to and guides the base mount frame 251 during movement along the guide rail 253. At the guide groove, there are provided multiple driving rollers (not shown) for movement of the base mount frame 251 back and forth along the guide rail 253. A mount tape frame stocker 255, which holds a stack of the base mount tape frames 251, is at one end of the guide rail 253, and the mount tape frame loader 290, which holds a stack of base mount tape frames 251 when the die bonding process is complete, is at the other end of the guide rail 253.

The bonding unit 260, which performs the die bonding process, is at a central portion of the guide rail 253, and a CCD camera 257 for inspecting the land patterns is between the bonding unit 260 and the mount tape frame stocker 255. The CCD camera 257 photographs the land patterns of the base mount frame 251 for determination of status information indicating whether the land patterns are good or defective. A conventional pattern recognition system (not shown) can determine whether the land patterns are good or defective and store status information to indicate the results. The collet 234 picks up a good or defective semiconductor chip according to whether the status information indicates a corresponding land pattern is good or defective.

The bonding unit 260 further includes: an X-Y table (not shown) which the control module operates; a movable press head 262 coupled to the X-Y table; and a bonding unit CCD camera 264 fixed to the press head 262. The bonding unit CCD camera 264 is for confirming alignment of the land pattern of the mount tape and the transferred semiconductor chip and correcting deviations from the required alignment.

Figure 5:
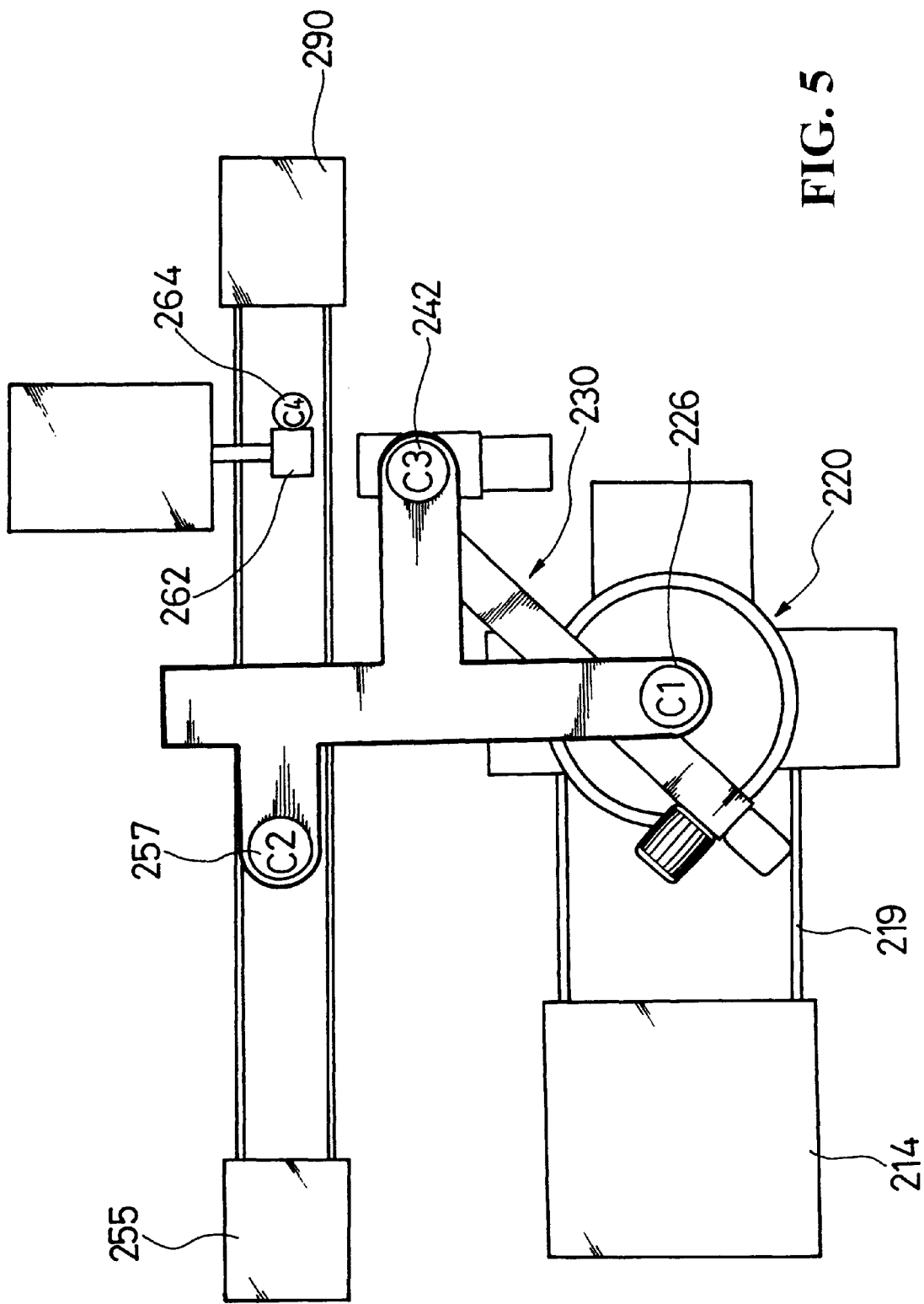
FIG. 5 is a schematic diagram showing the positions of CCD cameras in the equipment of FIG. 2.

FIG. 5 schematically shows a top view of the equipment 200 of FIG. 2 and illustrates the positions of the CCD cameras 226, 257, 242, and 264 in a camera frame 270. In FIG. 5, symbol C1 represents the chip pickup stage CCD camera 226 which is over the chip pickup stage 220, C2 represents the CCD camera 257 for determining whether the land patterns are good or defective, C3 represents the alignment stage CCD camera 242, and C4 represents the bonding unit CCD camera 264.

Figure 6A:
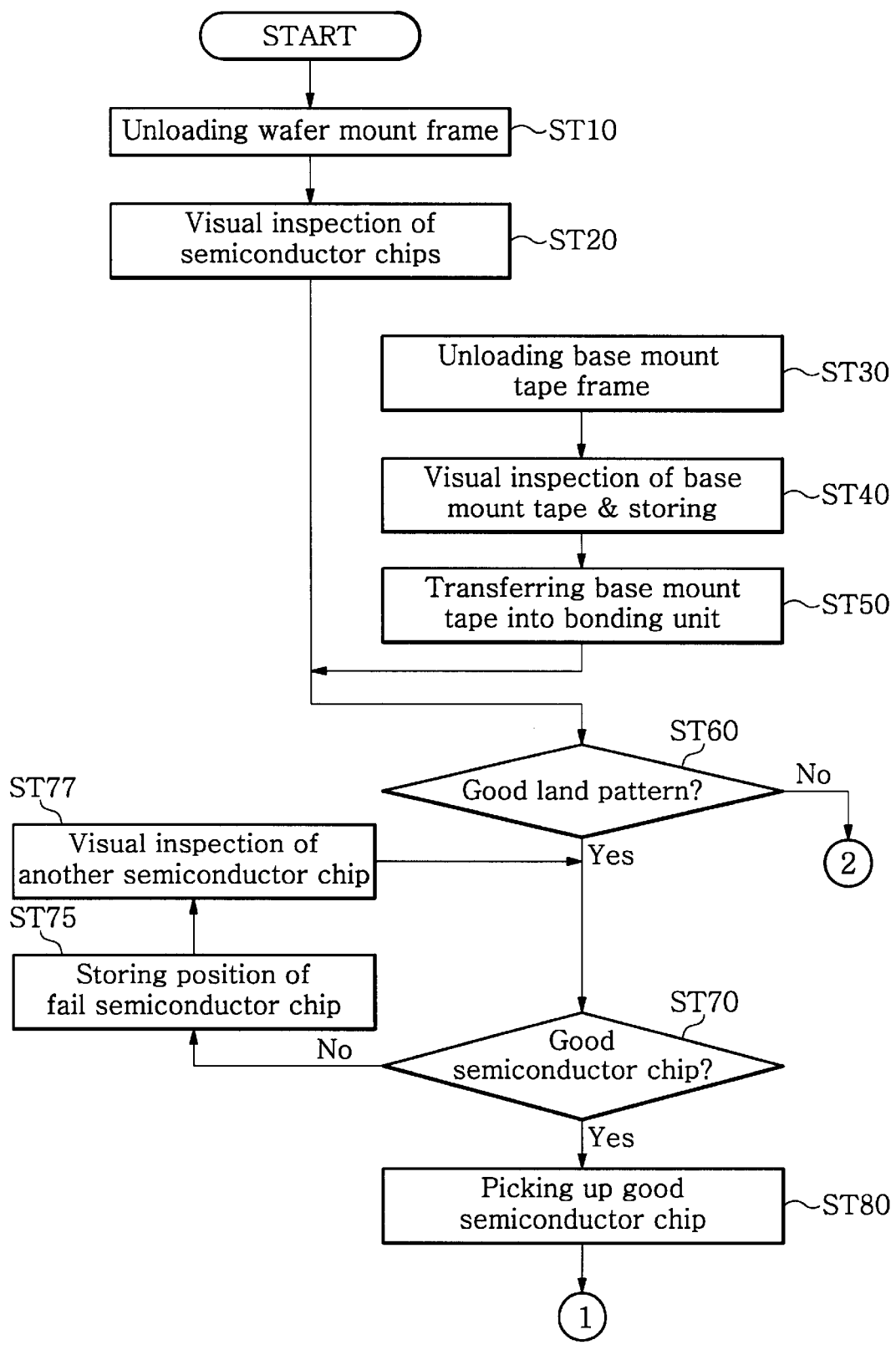
FIGS. 6A, 6B, and 6C together are a flow chart for a die bonding method for a fine pitch ball grid array package.
Figure 6B:
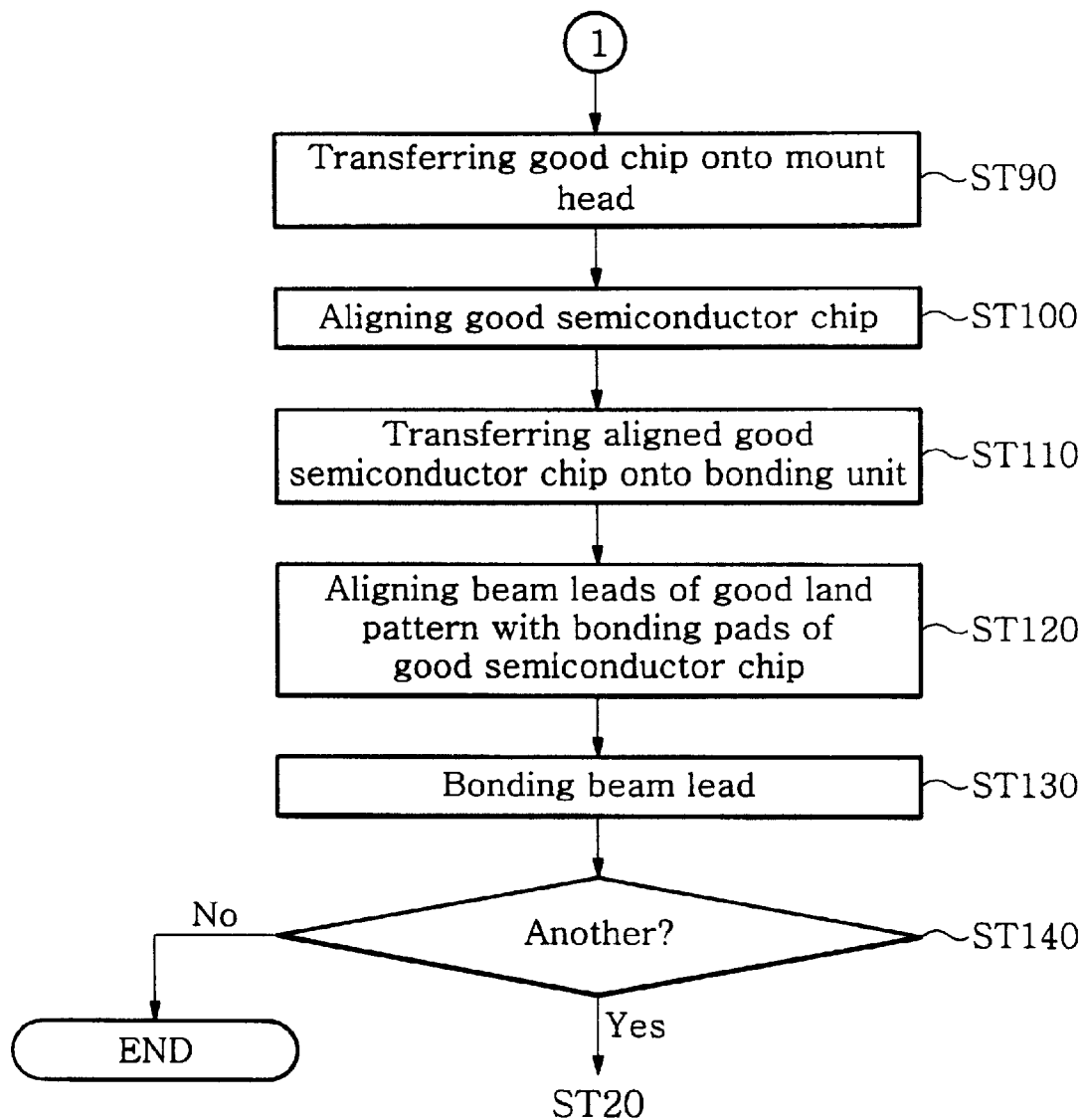
Figure 6C:
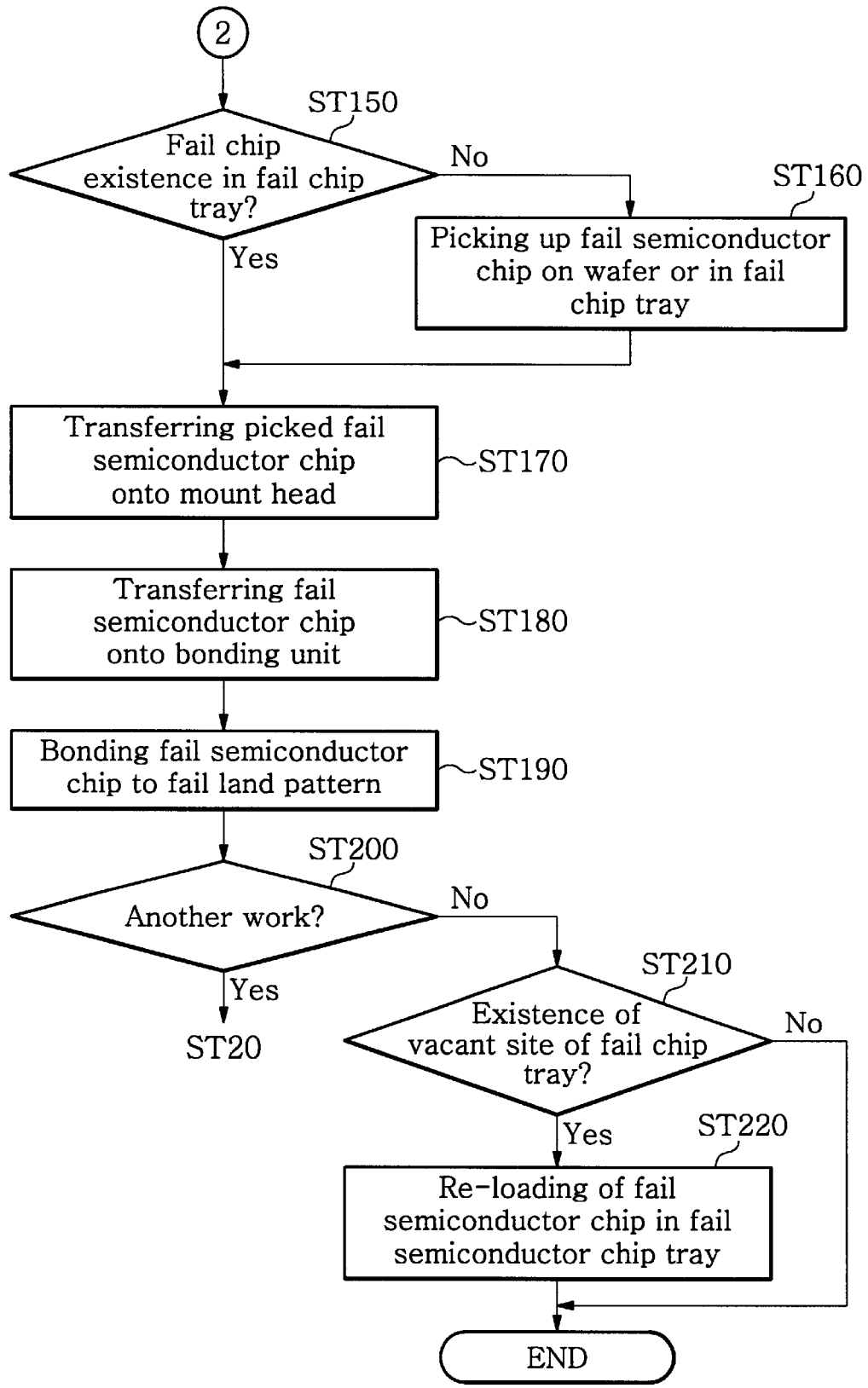

The die bonding equipment 200 of FIG. 2 can perform a die bonding process illustrated in FIGS. 6A, 6B, and 6C. Prior to the die bonding, a wafer on which processes for the fabrication of a plurality of semiconductor chips have been completed, is prepared and is mounted on one of the wafer mount frames 212. The wafer mount frame 212 has a diameter greater than that of the wafer. At this time, the backside of the wafer is attached to the wafer mount frame 212. The wafer is then sawed along the scribe lines to separated individual chips. The wafer mount frames 212, each having multiple separated semiconductor chips, are loaded into the mount frame stocker 214.

In an initial step ST10 of the die bonding process, the mount frame moving unit 216 unloads one of the wafer mount frames 212 that contains separated semiconductor chips from the mount frame stocker 214 and then loads the mount frame 212 onto the ring shaped stage 222 of the chip) pickup stage 220.

Meanwhile, a step ST30 unloads from the mount tape frame stocker 255 a base mount tape frame 251 having a base mount tape to which a semiconductor chip will be die-bonded. A step ST40, which is during the unloading of the base mount tape frame 251 from the mount tape frame stocker 255 and the transfer to the bonding unit 260, includes a visual inspection of the base mount tape using CCD camera 257 to determine whether the land patterns on the base mount tape 251 ire good or defective. The status information indicating the results of the determination are then stored in the memory device.

Figures 8, 9:
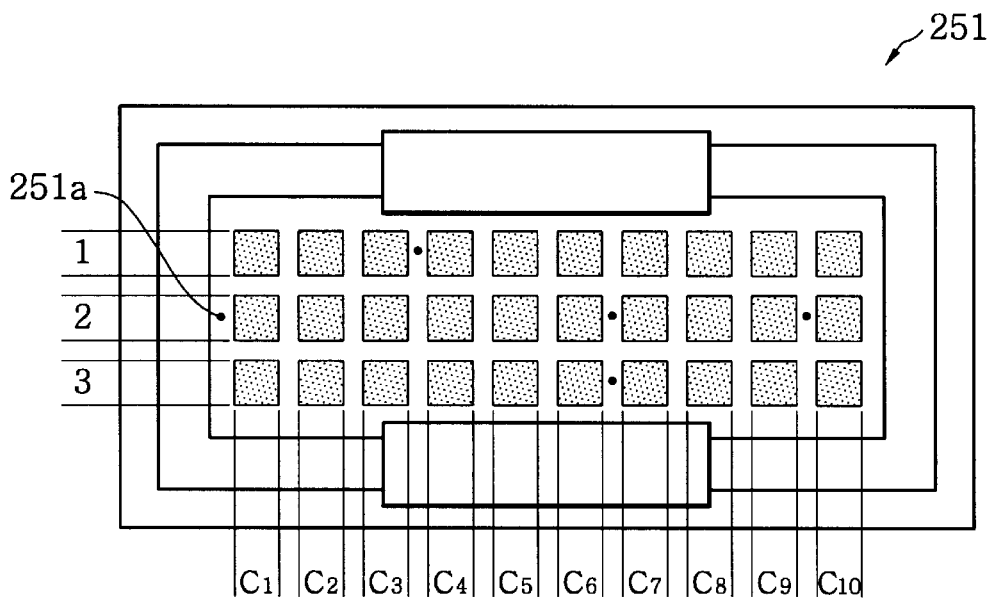
FIG. 8 is a plan view of a base mount tape fixed on a base mount frame.
FIG. 9 is a schematic view of a memory table or data structure storing status and position information for the land pattern of the base mount tape.

FIG. 8 shows a base mount tape 251, and FIG. 9 shows a data structure 500 that includes,; the status data corresponding to the base mount tape 251. For step ST40, the CCD camera 257 photographs land patterns C11, C12, and C13 first and determines whether the photographed land patterns are good or defective. The determined status information for the land patterns C11, C12, and C13 are stored at addresses corresponding to entries T11, T12, and T13 in data structure 500 of FIG. 9

In the example of FIGS. 8 and 9, the land patterns C11 and C13 did not fail the inspection and are determined to be good land patterns. Accordingly, corresponding entries T11 and T13 of the data structure 500 store a value G. In this example, the land pattern C12 failed the visual inspection and is determined to be defective. Accordingly, the corresponding entry T12 stores a symbol F. Visual inspection similarly determines the status information for all land patterns. For example, the 30 land patterns of the base mount tape attached on the base mount tape frame 251 of FIG. 8 and their determined status data are stored in corresponding addresses of the data structure 500.

A step ST50 transfers the base mount tape frame 251 to the bonding unit 260 while visual inspection continues. After the visual inspection is completed and the inspection data of land patterns are stored, a step ST60 determines from the status information in the data structure 500 whether a first land pattern for a die bonding process is good or defective.

When the first land pattern is good, the process transfers from step ST60 to a step ST70. Step ST70 uses the status information stored in the memory device for the semiconductor chips and determines whether a semiconductor chip currently positioned for transfer for the die bonding process is good or not.

Figure 7:
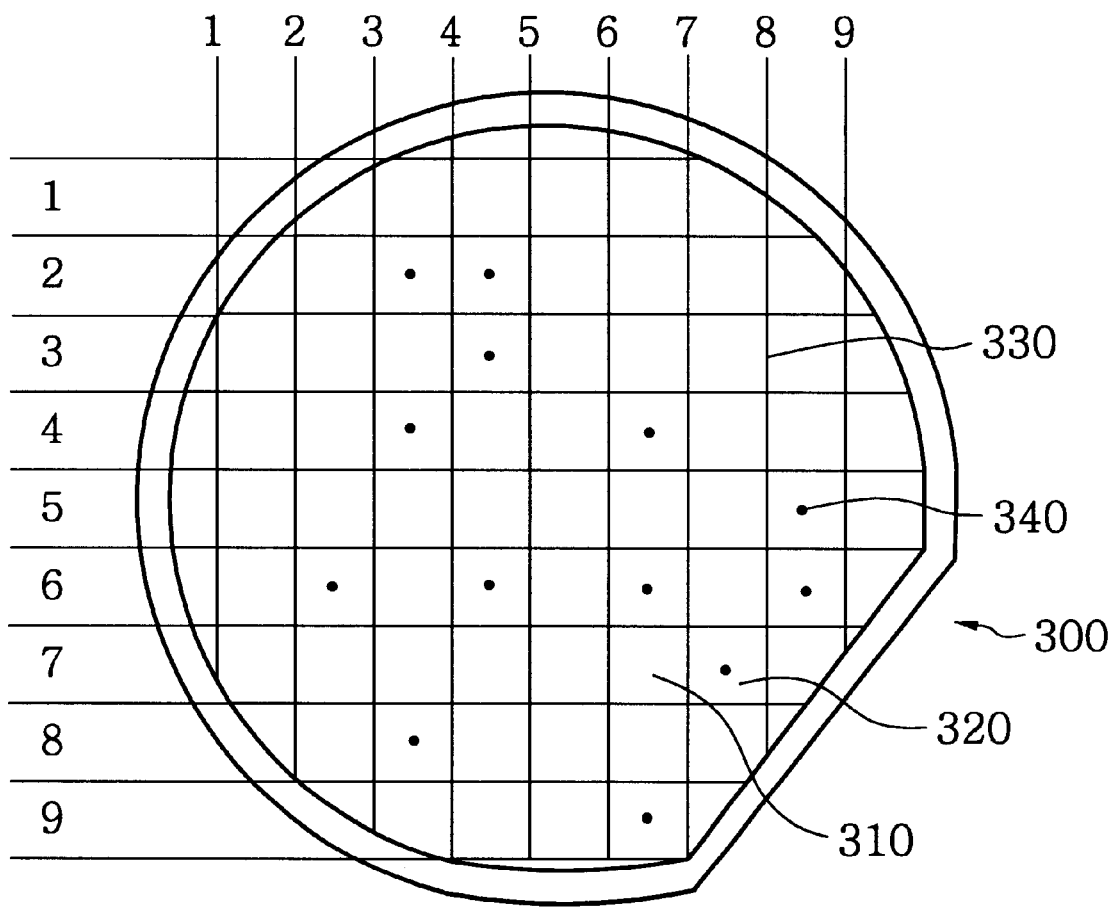
FIG. 7 is a plan view of a wafer fixed on a wafer mount frame.

From step ST70, when the inspected semiconductor chip proves to be defective, step ST75 stores the defective semiconductor chip in the defective semiconductor chip tray 236. Thereafter, step ST77 visually inspects another semiconductor chip on the chip pickup stage 220 before the process returns to step ST70. A matrix such as the one illustrated in FIG. 7 can store the status information for the semiconductor chips from the chip pickup stage 220. Each semiconductor chip from the chip pickup stage 220 has a corresponding matrix element, and the value of the corresponding matrix element indicates whether the chip is good or defective. In the example of FIG. 7, dots mark the defective chips. For example, a matrix element corresponding to a semiconductor chip in row 2 and column 3 and matrix element corresponding to a semiconductor chip in row 2 and column 4 indicate that the corresponding chips are defective.

When step ST70 determines the semiconductor chip is good, the chip transfer unit 230 picks up the good semiconductor chip in a step ST80.

In a step ST90 (FIG. 6B), the chip transfer unit 230 transfers the good semiconductor chip to the mount head 244 of the chip alignment stage 240. The chip alignment stage 240 precisely aligns the chip in the die bonding position in a step ST100, subsequent to transferring of the semiconductor chip to the bonding unit 260 in a step ST110. More specifically, in step ST100, the alignment stage CCD camera 242 photographs the good semiconductor chip when transferred onto the chip alignment stage 240. When photographing indicates an alignment failure, the mount head 244 having the good semiconductor chip thereon rotates or moves up or down to align the good semiconductor chip. After the alignment is complete, the mount head 244 loads the good semiconductor chip onto the bonding unit 260 in step ST110.

At this time, the base mount tape frame 251 has been loaded on the bonding unit 260 and awaits the bonding process. When both of the good semiconductor chip and the base mount tape frame 251 are loaded onto the bonding unit 260, the bonding unit CCD camera 264 inspects whether the beam leads of the land patterns formed on the base mount tape of the base mount tape frame 251 are precisely aligned with bonding pads of the good semiconductor chip. A step ST120 aligns the base mount tape and the good semiconductor chip for beam lead bonding. After step ST120, a step ST130 is the beam lead bonding that the bonding unit 260 performs.

After a certain time elapses, a step ST 140 determines whether or not another land pattern for die bonding still remains. If a land pattern for die bonding does not remain, the die bonding process is complete. If a land pattern for die bonding still remains, the process returns to step ST20, which determines whether the semiconductor chip that is being die bonded to the land pattern is good or bad. The visual inspection classifies the semiconductor chip as good or defective, and the classification result is stored. In addition, inspection step ST60 again determines from the stored status data whether a land pattern that is being die-bonded is good or defective. If in step ST60 the land pattern proves not to be good, the process proceeds to a step ST150, which determines whether or not there is a defective semiconductor chip in the fail semiconductor chip tray 236. When no defective semiconductor chips remain in the semiconductor chip tray 236, the collet 234 picks up a defective semiconductor chip that is identified from the position data that was stored in step ST75. Otherwise, when the semiconductor chip tray 236 contains a defective semiconductor chip, the collet 234 picks up a defective semiconductor chip from the semiconductor chip tray 236. In a step ST170, the chip transfer unit 230 transfers the defective semiconductor chip as picked up to the mount head 244 of the chip alignment stage 240.

For a defective semiconductor chip transferred to the chip alignment stage 240 through steps ST150 to ST170, a step ST180 transfers the defective semiconductor chip directly to the bonding unit 260 without an alignment process. The bonding unit 260, in a step ST190, performs the die bonding for such defective semiconductor chips and defective land patterns.

After step ST190, a step ST200 determines whether or not a land pattern remains for die bonding and whether another die bonding is needed. If a land pattern for die bonding remains, tie process returns to the step ST20 and repeatedly performs the steps from ST20 to ST200. When no land pattern remains for further die bonding, a step ST210 determines whether the semiconductor chip tray 236 has room for another defective semiconductor chip. When there is a vacant site in the semiconductor chip tray 236, the chip transfer unit 230, in a step ST220, loads a defective semiconductor chip from the wafer mount frame 212 onto the semiconductor chip tray 236.

As described previously, the present invention prevents a mismatched bonding such as die bonding a good semiconductor chip to a defective land pattern or die bonding a defective semiconductor chip to a good land pattern. In particular, visual inspection determines whether a land pattern that is being die-bonded to a selected semiconductor chip is good or defective prior to the picking up of the semiconductor chip. Moreover, the invention enhances productivity during the die bonding process by automatically transferring the defective semiconductor chips into the semiconductor chip tray using the bonding unit.

The present invention is not limited to the above-described embodiments. Various changes and modifications may be effected and remain within the scope of the invention, as defined by the appended claims.

What is claimed is:

1. A die bonding method for fine pitch ball grid array package comprising:

inspecting a status of a semiconductor chip, which is on a first mount frame containing a plurality of semiconductor chips, and a status of a land pattern of a mount tape, wherein the land pattern is formed on one surface of the mount tape and the other surface of the mount tape is attached to a second mount frame;

transferring the mount tape to a bonding unit after the inspecting of the land pattern;

selecting one of the semiconductor chips that has a status corresponding to the status of the land pattern; and transferring the selected chip for bonding to the land pattern.

2. The die bonding method of claim 1, further comprising storing status data resulting from the inspecting, wherein the status data represents whether each land pattern of the mount tape is good or defective.

3. The die bonding method of claim 1, wherein transferring the selected chip comprises:

moving the selected chip to the land pattern after performing an alignment if the selected chip is good; and moving the selected chip to the land pattern without performing an alignment if the selected chip is defective.

4. The die bonding method of claim 3, wherein if the selected chip is good, the transferring further comprises further aligning the good semiconductor chip with the land pattern, after transferring the selected chip to the land pattern which is placed at a die bonding region.

5. The die bonding method of claim 1, wherein inspecting the semiconductor chips comprises:

inspecting the status of the semiconductor chip using a first CCD camera for a chip inspection; and inspecting the status of the land pattern using a second CCD camera between a mount tape stocker and a die bonding unit.

6. The die bonding method of claim 5, wherein the inspecting of the land pattern is performed before the selected chip arrives at the die bonding unit.

7. The die bonding method of claim 6, wherein the second CCD camera inspects the land pattern when the land pattern is temporarily stopped.

8. The die bonding method of claim 6, wherein the second CCD camera inspects the land pattern when the land pattern is moving.

9. The die bonding method of claim 1, wherein the selecting determines whether the land pattern that is at a die bonding region is good or defective, if the land pattern is good, the selecting selects a good semiconductor chip; and if the land pattern is defective, the selecting selects a defective semiconductor chip.

10. The die bonding method of claim 9, wherein when the land pattern is good and an inspected semiconductor chip on the mount frame is defective, the selecting comprises:

storing a position of the defective semiconductor chip in a memory;

inspecting another of the semiconductor chips; and selecting a semiconductor chip that is good from among the semiconductor chips.

11. The die bonding method of claim 9, wherein when the land pattern is defective, the selecting comprises:

determining whether a semiconductor chip tray disposed on a transfer path of a chip holding member contains a defective semiconductor chip, the chip holding member being disposed in a chip transfer unit that connects a chip pickup region and an alignment region; and when no defective semiconductor chip is in the semiconductor chip tray, using the chip holding member to select a defective semiconductor chip from the first mount frame, the defective semiconductor chip being identified from the position which is stored in the memory, and then transferring the selected defective semiconductor chip to the alignment region.

12. A die bonding method comprising:

(a) inspecting a land pattern;

(b) in response to the inspecting indicating that the land pattern is good, performing a first selection process that comprises:

(b1) inspecting a chip that is on a wafer mount frame;

(b2) if the inspecting of the chip indicates the chip is good, selecting the chip for bonding to the land pattern and ending the first selection process; and (b3) if the inspecting of the chip indicates the chip is defective, inspecting another chip if any remains in the wafer mount frame that previous inspecting has not indicated as defective and returning to step (b2); and (c) in response to the inspecting indicating that the land pattern is defective, performing a second selection process that selects a defective chip for bonding to the land pattern.

13. The die bonding method of claim 12, wherein the first selection process further comprises storing status data indicating the chip is defective if the inspecting indicates that the chip is defective.

14. The method of claim 13, further comprising moving the chip that inspecting indicated was defective, to a tray.

15. The die bonding method of claim 14, wherein the second selection process comprises:

selecting the defective chip from the tray for bonding to the land pattern if the tray is not empty; and selecting the defective chip from the wafer mount frame for bonding to the land pattern if the tray is empty.

* * * * *